US011820648B2

(12) United States Patent
Liukku et al.

(10) Patent No.: US 11,820,648 B2
(45) Date of Patent: Nov. 21, 2023

(54) VIBRATION DAMPING IN MEMS ACCELERATION SENSORS

(71) Applicant: MURATA MANUFACTURING CO., LTD., Nagaokakyo (JP)

(72) Inventors: Matti Liukku, Helsinki (FI); Ville-Pekka Rytkönen, Klaukkala (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 596 days.

(21) Appl. No.: 17/052,287

(22) PCT Filed: May 13, 2019

(86) PCT No.: PCT/IB2019/000356
§ 371 (c)(1),
(2) Date: Nov. 2, 2020

(87) PCT Pub. No.: WO2019/220202
PCT Pub. Date: Nov. 21, 2019

(65) Prior Publication Data
US 2021/0171337 A1    Jun. 10, 2021

(30) Foreign Application Priority Data

May 15, 2018 (FI) .................................. 20185445

(51) Int. Cl.
*B81B 7/00* (2006.01)
*G01P 15/125* (2006.01)
*G01P 15/08* (2006.01)

(52) U.S. Cl.
CPC .......... *B81B 7/0016* (2013.01); *G01P 15/125* (2013.01); *B81B 2201/0235* (2013.01); *G01P 2015/0882* (2013.01)

(58) Field of Classification Search
CPC ..................................................... B81B 7/0016
See application file for complete search history.

(56) References Cited

U.S. PATENT DOCUMENTS

| 6,440,766 B1 * | 8/2002 | Clark ................. B81C 1/00246 |
| | | 216/2 |
| 6,531,331 B1 * | 3/2003 | Bennett .............. B81C 1/00246 |
| | | 438/561 |

(Continued)

FOREIGN PATENT DOCUMENTS

| EP | 3 121 605 A1 | 1/2017 |
| JP | 2005-249454 A | 9/2005 |

OTHER PUBLICATIONS

International Search Report and Written Opinion dated Sep. 13, 2019 corresponding to International Patent Application No. PCT/IB2019/000356.

(Continued)

*Primary Examiner* — Caleb E Henry
(74) *Attorney, Agent, or Firm* — SQUIRE PATTON BOGGS (US) LLP

(57) ABSTRACT

A capacitive microelectromechanical acceleration sensor where one or more rotor measurement plates and one or more stator measurement plates are configured so that the movement of a proof mass in the direction of a sense axis can be measured in a capacitive measurement conducted between them. One or more first rotor damping plates and one or more first stator damping plates form a first set of parallel plates which are orthogonal to a first damping axis, and the first damping axis is substantially orthogonal to the sense axis.

5 Claims, 4 Drawing Sheets

(56) References Cited

U.S. PATENT DOCUMENTS

| | | | | |
|---|---|---|---|---|
| 6,611,033 B2* | 8/2003 | Hsu | | H01L 27/1203 |
| | | | | 257/421 |
| 7,023,065 B2* | 4/2006 | Ayazi | | H03H 9/2463 |
| | | | | 257/415 |
| 8,117,915 B1* | 2/2012 | Cardarelli | | G01P 15/125 |
| | | | | 73/504.15 |
| 2002/0098611 A1* | 7/2002 | Chang | | B81C 1/00246 |
| | | | | 438/52 |
| 2011/0291644 A1* | 12/2011 | Kanemoto | | G01P 15/18 |
| | | | | 324/162 |
| 2013/0192370 A1* | 8/2013 | Yoda | | G01P 15/02 |
| | | | | 73/514.01 |
| 2013/0265070 A1* | 10/2013 | Kleks | | G01P 15/125 |
| | | | | 324/750.3 |
| 2015/0000403 A1* | 1/2015 | Liukku | | G01P 15/18 |
| | | | | 73/510 |
| 2015/0053002 A1 | 2/2015 | Ullrich et al. | | |
| 2015/0198216 A1* | 7/2015 | Koyama | | F16F 7/104 |
| | | | | 267/136 |
| 2015/0301075 A1* | 10/2015 | Yamanaka | | G01P 15/0802 |
| | | | | 73/514.32 |
| 2015/0316667 A1* | 11/2015 | Projetti | | G01V 1/164 |
| | | | | 73/514.02 |
| 2017/0089946 A1* | 3/2017 | Liukku | | G01P 15/125 |
| 2017/0356928 A1 | 12/2017 | Bernal et al. | | |
| 2017/0366103 A1* | 12/2017 | Ba-Tis | | H02N 1/002 |
| 2019/0064201 A1* | 2/2019 | Tanaka | | G01C 19/5628 |
| 2021/0122628 A1* | 4/2021 | Peussa | | B81C 1/00142 |
| 2021/0130164 A1* | 5/2021 | Li | | B81B 7/008 |
| 2021/0171337 A1* | 6/2021 | Liukku | | G01P 15/125 |

OTHER PUBLICATIONS

Finnish Search Report dated Dec. 27, 2018 corresponding to Finnish Application No. 20185445.

F. Cui et al. "Design, Fabrication and Levitation Experiments of a Micromachined Electrostatically Suspended Six-Axis Accelerometer," In: Sensors Nov. 28, 2011, 11206-11234.

F. Han et al., "Performance of a Sensitive Micromachined Accelerometer with an Electrostatically Suspended Proof Mass," In: IEEE Sensors Journal, Jan. 2015, vol. 15, 209-217.

R. Toda et al., "Electrostatically Levitated Spherical 3-Axis Accelerometer," In: IEEE, 2002, 710-713.

R. Houlihan et al., "Modelling of an accelerometer based on a levitated proof mass," In: Journal of Micromechanics and Microengineering, May 16, 2002, 1-8.

\* cited by examiner

VIBRATION DAMPING IN MEMS ACCELERATION SENSORS

FIELD OF THE DISCLOSURE

The present disclosure relates to capacitive acceleration sensors, and more particularly to damping of undesired vibratory movements caused by external disturbances. The present disclosure further concerns the arrangement of damping plates in both in-plane and out-of-plane acceleration sensing.

BACKGROUND OF THE DISCLOSURE

Microelectromechanical (MEMS) sensors typically measure acceleration in the direction of one, two or three predefined sensing axes. Measurement applications are not restricted to isolated environments, where the sensor would only experience the movement which is to be measured. Instead, the sensor may undergo a number of disturbing movements which should preferably not influence the measurement at all.

Acceleration sensors may for example be used in applications where they are exposed to high-frequency vibration caused by system resonances. A sensor will be sensitive to such disturbing vibrations if they fall within the frequency band which the sensor is designed to measure (the frequency of a singular acceleration event may in this context be interpreted as the inverse of its duration).

High-frequency acceleration measurements, where the sensor is very sensitive and has a fast response, may be disturbed by resonance vibrations in the sensor package or in the surrounding electronics. One way to minimize the influence of such resonances is to increase the stiffness of the resonating structure, which shifts the resonance to higher frequencies which may lie outside of the frequency range of the sensor. However, the resonance frequencies of electronic components tend to change during their lifetime, and the properties of every resonating element in the surroundings of a MEMS sensor cannot be adjusted to avoid the frequency range of the sensor.

Undesired vibratory motion may therefore also be reduced by tuning the frequency sensitivity of the sensor, so that it becomes less sensitive to disturbances. Electric damping or gas damping between different parts of the sensor can make the sensor behave like a low-pass filter with a desired cut-off frequency. The more damping is generated, the lower the cut-off frequency moves.

The amount of damping that a given capacitive MEMS acceleration sensor structure requires depends on the stiffness of its mobile structures and on the vibrations that the sensor is expected to be exposed to in its operating environment. Electric damping can usually be made to cancel unwanted vibrations effectively, but it requires multiple sets of electrically active damping plates (one set on the mobile mass and another set on the stationary support structure which surrounds the mobile mass) and additional electrical circuitry.

Electrically passive gas damping plates can usually be implemented more simply in an acceleration sensor. Gas damping is typically constructed in the direction of the measurement axis, where the sensor is most sensitive. The capacitive measurement electrodes of the acceleration sensor may sometimes be used also as gas damping plates if their surface area and the gap between adjacent electrodes is sufficient for this purpose. Parallel plate structures dedicated specifically to damping may also be implemented.

Document JP2005249454 discloses an acceleration sensor where a proof mass has an asymmetric mass distribution in relation to a rotation axis in the substrate plane, so that it undergoes seesaw motion about the rotation axis when exposed to an in-plane acceleration component perpendicular to the rotation axis. The proof mass is equipped with gas damping plates for damping unwanted in-plane vibrations along the sense axis.

A problem with implementing gas damping only in the direction of the measurement axis is that the sensor may still be vulnerable to vibration disturbances in other directions.

BRIEF DESCRIPTION OF THE DISCLOSURE

An object of the present disclosure is to provide an apparatus for solving the above problems.

The object of the disclosure is achieved by an arrangement characterized by what is stated in the independent claims. The preferred embodiments of the disclosure are disclosed in the dependent claims.

The disclosure is based on the idea of implementing gas damping plates which are oriented in such a way in an acceleration sensor that they dampen vibrations which occur in a direction which is orthogonal to the measurement axis.

An advantage of this arrangement is that the sensor becomes more robust and can be employed in conditions where vibration disturbances are more varied or unpredictable.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

This disclosure describes a capacitive microelectromechanical acceleration sensor which comprises at least one partly mobile proof mass which is configured to move in the direction of a sense axis when the sensor undergoes acceleration in the direction of the sense axis. The sensor also comprises one or more rotor measurement plates and one or more first rotor damping plates attached to the proof mass, as well as one or more stator measurement plates and one or more first stator damping plates attached to a fixed structure in the sensor.

The one or more rotor measurement plates and the one or more stator measurement plates are configured so that the movement of the proof mass in the direction of the sense axis can be measured in a capacitive measurement conducted between them.

The one or more first rotor damping plates and the one or more first stator damping plates form a first set of substantially parallel plates which are substantially orthogonal to a first damping axis, and the gaps between the one or more first rotor damping plates and the one or more first stator damping plates are configured to be sufficiently narrow to facilitate gas damping in the direction of the first damping axis. The first damping axis is substantially orthogonal to the sense axis.

In this disclosure, the word "rotor" refers to elements of the acceleration sensor which are partly mobile in relation to the rigid substrate of the sensor. The word refers particularly to elements that are attached to the proof mass or form one part of the proof mass. The proof mass is typically suspended from an underlying substrate or a surrounding fixed frame by flexible suspenders, so that it can be displaced from its rest position when the sensor undergoes acceleration.

In this disclosure, the word "stator" refers to elements of the acceleration sensor which are rigidly attached to a fixed part of the sensor. The attachment point may be called an anchor point.

In this disclosure, the expression "configured to move in the direction of a sense axis" can refer to either to linear translation in the direction of the sense axis, or to rotation around an axis which is substantially perpendicular to the sense axis. In other words, the proof mass may either be suspended from a fixed structure by flexible suspenders which allow it to move along the sense axis when the sensor accelerates, or it may be suspended by torsional suspenders which allow the proof mass to rotate about the torsion axis defined by the torsional suspenders when the sensor accelerates. In the latter arrangement, a necessary condition for the sensor to work is that the center of gravity of the proof mass should not be located on the torsion axis. In other words, the expression "configured to move in the direction of the sense axis" also covers rotational motion where the center of gravity of the proof mass (but not necessarily all parts of the proof mass) is shifted in the direction of the sense axis.

Figure 1:
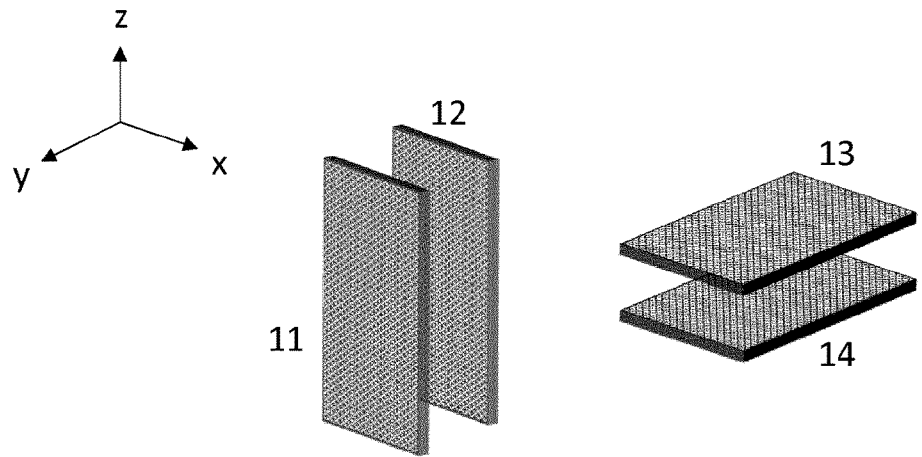
FIG. 1 illustrates measurement and damping plates.

In this disclosure, the terms "measurement plate" and "damping plate" refers to adjacent flat structures which may be used for capacitive measurements and/or for gas damping. FIG. 1 illustrates one pair of plates 11 and 12 which are narrow in the y-direction, but wide in the x-direction and high in the z-direction. If plates 11 and 12 would be viewed in the xy-plane, they would have the appearance of narrow fingers. Capacitively measured acceleration sensors often comprise sets of interdigitated finger electrodes in the xy-plane. Such finger electrodes typically have a substantial height in the z-direction so that the measurement area is maximized. In other words, the use of the expression "plate" in this disclosure does not rule out the possibility that the plate may have the appearance of a finger when viewed from a certain angle.

If the plates 11 and 12 are used for a capacitive acceleration measurement, they can in principle be configured to measure acceleration in any direction, x-, y- or z. In other words, the sense axis may be parallel to the x-, y- or z-axis. If the acceleration is either in the x-direction or the z-direction, the acceleration changes the effective area of the capacitor. Acceleration in the y-direction, on the other hand, changes the distance between the capacitive plates. Plates 13 and 14 illustrate an arrangement where an acceleration in the z-direction changes the distance between the plates.

If plates 11 and 12 are used for gas damping, they can only damp motion which occurs in the y-direction in FIG. 1. Similarly, plates 13 and 14 can only damp motion which occurs in the z-direction. If certain plates are used both for measurement and damping, then there is no fixed relationship between the sensing axis and the damping axis. The damping axis may or may not be parallel with the sensing axis.

In this disclosure, the expression "damping axis" refers to the direction in which a given set of damping plates can dampen vibrations. It should be noted that the movement which is dampened does not necessarily have to occur entirely in the direction of the damping axis. Any movement which has a nonzero component in the direction of a damping axis can be dampened by the damping plates. The movement may, for example, be linear translation in a direction which differs from the direction of the damping axis by an angle. The motion component along the damping axis, with a momentum proportional to the total momentum multiplied by cos, can in this case be dampened. The movement may alternatively be rotational motion about the z-axis (or any other axis), and again the momentary motion component in the direction of the damping axis can be dampened.

Measurement plates and damping plates need not necessarily be exactly aligned with each other in their rest position, and they may not have the same size. For example, plate 11 could be recessed from both its upper and lower sides, so that its upper edge lies at a lower z-coordinate than the upper edge of plate 12, and its lower edge lies at a higher z-coordinate than the lower edge of plate 12.

In this disclosure, the term "horizontal" may be used to refer to the xy-plane, which is assumed to correspond to the device plane defined by the surface of the substrate where the partly mobile elements of the acceleration sensor are formed. The device plane may also be called the substrate plane. The term "vertical" may be used to refer to the z-direction. Terms such as "upper", "lower", "vertical" and "horizontal" do not imply anything about the orientation of the substrate when the device is manufactured, or when the device is in use. The device and the substrate may be oriented in any suitable direction during usage and manufacturing, for example sideways in such a manner that a plane which is in this disclosure referred to as "horizontal", becomes vertical. In other words, the terms "horizontal" and "vertical" merely define two orthogonal directions, one of which is parallel to a substrate surface, and the other of which is normal to that surface.

Furthermore, linear or rotational motion where the proof mass remains level in the substrate plane may be referred to as "in-plane" motion in this disclosure, while linear or rotational motion where the proof mass (or its center of gravity) moves in a vertical direction may be referred to as "out-of-plane" motion. As described in the embodiments below, the acceleration sensor may be an in-plane acceleration sensor configured to measure acceleration in the x-direction and/or the y-direction, or it may be an out-of-plane acceleration sensor configured to measure acceleration in the z-direction.

The fixed structure of the sensor, to which stator plates may be attached, may for example be a fixed frame which surrounds the mobile proof mass, any substantially rigid structure which is attached to an anchor point, or the horizontal inner plane of a packaging structure which lies vertically adjacent to the substrate plane.

In this disclosure, expressions such as "substantially parallel" and "substantially orthogonal" refer to the orientation of plates in relation to each other, and in relation to separately specified axes. Although the strongest capacitive signal and the strongest damping effect are typically achieved when the orientation is fully parallel/orthogonal orientation, the person skilled in the art will understand that the same technical effect can be generated even if the orientation deviates to some extent from this ideal.

The configuring of the gap between two adjacent plates sufficiently narrow to facilitate gas damping in the direction which is orthogonal to the plates may be a part of a broader design process where the geometry of both measurement plates and damping plates are optimised. In general, the required gap depends at least on the expected acceleration range, the weight of the proof mass (and possibly the location of its center of gravity with regard to a rotation axis), the flexibility of the proof mass suspenders for the kind of proof mass movement which is to be dampened, and on the shared surface area of the damping plates. Furthermore, the gap may also be optimized for other purposes, especially if the plate is used both as a measurement plate and as a damping plate. The gap between two adjacent plates intended for gas damping may, for example, be between 0.5 µm and 5 µm, but gaps outside of this range are also possible if any of the variables specified above deviate significantly from their typical values.

Exemplary acceleration sensor structures are illustrated in the embodiments below. For reasons of clarity, the illustrations are only schematic. The number of measurement plates and damping plates would in practice be much larger than in the illustrations. In all embodiments presented below, the one or more first stator damping plates and/or the one or more second stator damping plates may be configured to be at the same electric potential as the one or more first rotor damping plates and the one or more second rotor damping plates, respectively.

First Embodiment

Figure 2A:
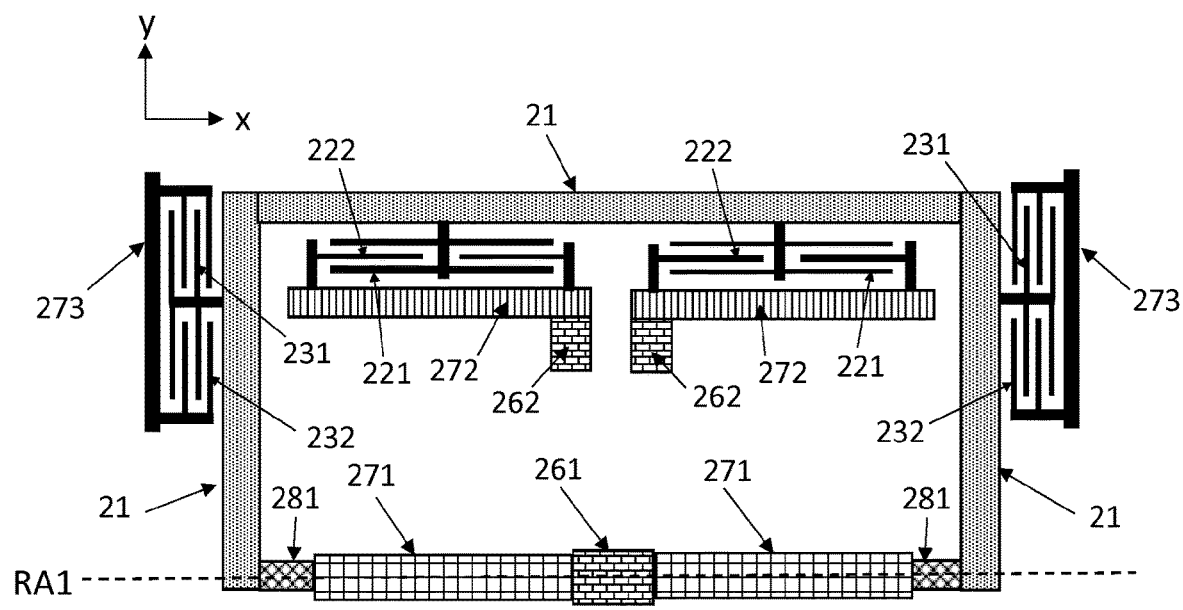
FIGS. 2a-2d illustrate out-of-plane acceleration sensors.

In a first embodiment, the sensor may be an out-of-plane sensor, where the sense axis is orthogonal to the substrate plane. FIG. 2a illustrates an out-of-plane sensor which comprises a proof mass 21. The proof mass is a shaped as a frame, and it is configured to be rotatable about a rotation axis RA1 when the sensor undergoes acceleration in the z-direction, which is perpendicular to the substrate plane. The proof mass 21 may be suspended from first anchor point 261 and first anchor bars 271 by torsion bars 281, which are configured to be sufficiently flexible for torsional twisting to allow the proof mass 21 to swing out of the xy-plane when the sensor accelerates in either z-direction. The sense axis is in this case the z-axis.

The sensor may comprise a set of rotor measurement plates 221 attached to the proof mass, and a set of stator measurement plates 222 attached to a fixed structure such as second anchor bars 272, which are rigidly joined to second anchor points 262. The movement of the proof mass in the direction of the sense axis may be measured as a change in capacitance between the rotor measurement plates 221 and the stator measurement plates 222. Either the rotor measurement plates or the stator measurement plates may be recessed in the vertical direction, so that the upper or lower edges of the rotor measurement plates lie at different z-coordinates.

The sensor may also comprise a set of first rotor damping plates 231 attached to the proof mass, and a set of first stator damping plates 232, attached to the fixed structure 273. The fixed structure 273 may be an anchored bar on the side of the substrate. The first rotor damping plates 231 and the first stator damping plates 232 form a first set of parallel plates orthogonal to a damping axis. The vertical thickness of all first rotor damping plates and all second rotor damping plates discussed in this disclosure may be the same as the vertical thickness of the proof mass 21, which typically equals the thickness of the device wafer where the structures are formed. The vertical thickness of all first stator damping plates and all second stator damping plates may also be the same as the vertical thickness of the proof mass 21. Alternatively, some plates may be recessed from the surfaces defined by the proof mass, so that their vertical thickness is smaller than that of the proof mass.

The gaps between the damping plates are dimensioned to so narrow in the x-direction that vibrations in a certain range will be dampened by gas damping. In this case, the damping axis is parallel to the x-axis in FIG. 2a. The damping plates 231 and 232 thereby stabilize the proof mass against external vibrations in the direction of the x-axis. As illustrated in FIG. 2a, the damping plates 231-232 may be placed at the distal end of proof mass 21 in relation to rotation axis RA1. In other words, the damping plates may be placed far away from the rotation axis RA1, where they can produce a stronger torque on the proof mass 21.

In all of the embodiments described in this disclosure, separate stopper structures may be present in the acceleration sensor to prevent the proof mass from traveling too far. The gaps in the stopper structures may be narrower than the gaps between the damping plates (or the measurement plates), but no gas damping will occur at the stopper structures because their surface area is much smaller than the area of the damping plates.

Optionally, the one or more rotor measurement plates and the one or more stator measurement plates may form a second set of substantially parallel plates which are substantially orthogonal to a second damping axis, and the gaps between the one or more rotor measurement plates and the one or more stator measurement plates may be configured to be sufficiently narrow to facilitate gas damping in the direction of the second damping axis.

In FIG. 2a, rotor measurement plates 221 and stator measurement plates 222 are oriented so that the gaps between them are narrow in the y-direction. In addition to their use in the capacitive measurement, these plates may be used also as gas damping plates in the direction of a second damping axis, which is in this case parallel to the y-axis. In other words, the second damping axis may be substantially orthogonal to both the first damping axis and to the sense axis.

Figure 2B:
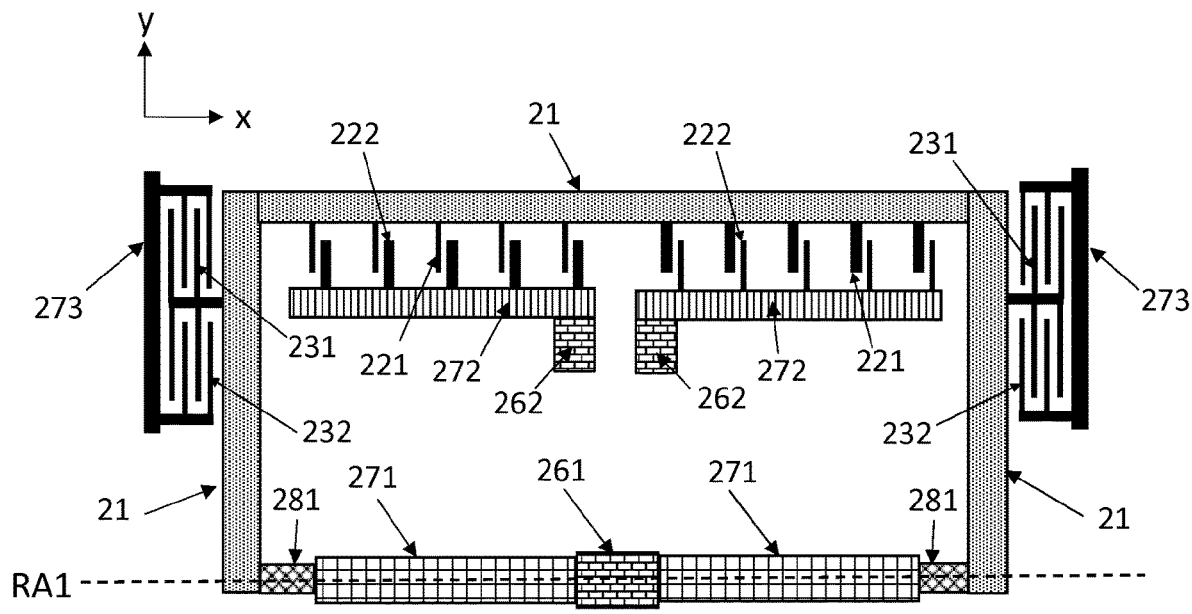

Alternatively, the second damping axis may be substantially parallel to the first damping axis and orthogonal to the sense axis. This is illustrated in FIG. 2b, where the gaps between the measurement plates are instead narrow in the x-direction. In this case the damping provided by the measurement plates supplements the damping provided by the first damping plates. It may be noted that the measurement plates are still configured to exhibit a change in capacitance when the proof mass undergoes out-of-plane motion. The change in capacitive area due to out-of-plane motion does not depend on the orientation of the measurement plates in the xy-plane.

The sensor may further comprise one or more second rotor damping plates attached to the proof mass and one or more second stator damping plates attached to a fixed structure in the sensor, wherein the one or more second rotor damping plates and the one or more second stator damping plates may form a second set of substantially parallel plates which are substantially orthogonal to a third damping axis, and the gaps between the one or more second rotor damping plates and the one or more second stator damping plates may be configured to be sufficiently narrow to facilitate gas damping in the direction of the third damping axis.

Figure 2C:
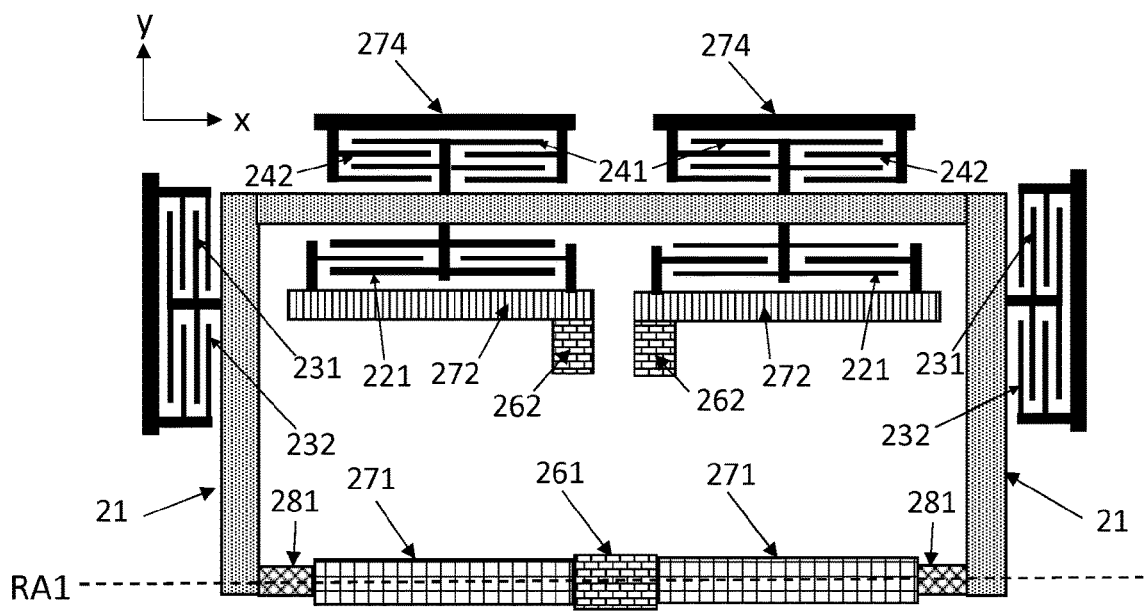

FIG. 2c illustrates an acceleration sensor which comprises, in addition to first rotor damping plates 231 and first stator damping plates 232, also second rotor damping plates 241 attached to the proof mass, and second stator damping plates 242 attached to fixed structures 274. In this case, the gaps between the second rotor damping plates 241 and the second stator damping plates 242 are narrow in the y-direction, so that the third damping axis is parallel to the y-axis. The second rotor and stator damping plates could also be implemented in the same position on the proof mass in FIG. 2b.

Figure 2D:
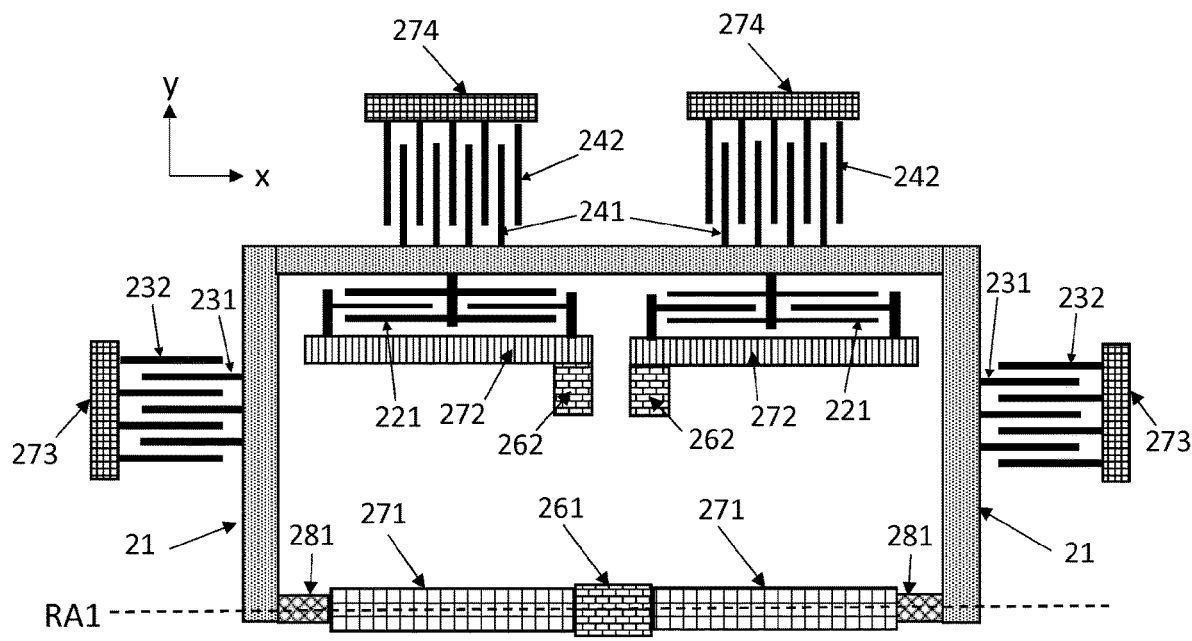

FIG. 2d illustrates an alternative configuration where first rotor and stator damping plates 231 and 232 are oriented so that the first damping axis is parallel to the y-axis. If the measurement plates 221 are also used for damping, then the second damping axis is parallel to the first damping axis. The second rotor and stator damping plates 241 and 242 are oriented so that the third damping axis is parallel to the x-axis. Compared to the arrangements illustrated in FIGS. 2a-2c, this arrangement has the additional benefit that the damping plates dampen also rotational movement of the proof mass about the z-axis.

The second damping plates may be used to supplement the damping which is optionally provided through the measurement plates, or to provide damping in a direction which is not covered by the first damping plates and the measurement plates. The third damping axis may be either orthogonal to both the first damping axis and to the sense axis.

If the measurement plates are used for damping in the direction of the second damping axis, orthogonal to the first damping axis, then the third damping axis may be parallel to the second damping axis and the second damping plates may supplement the damping provided by the measurement plates. If the measurement plates are not used for damping, the second damping plates may provide all the damping in the direction of the third damping axis.

Figure 3:
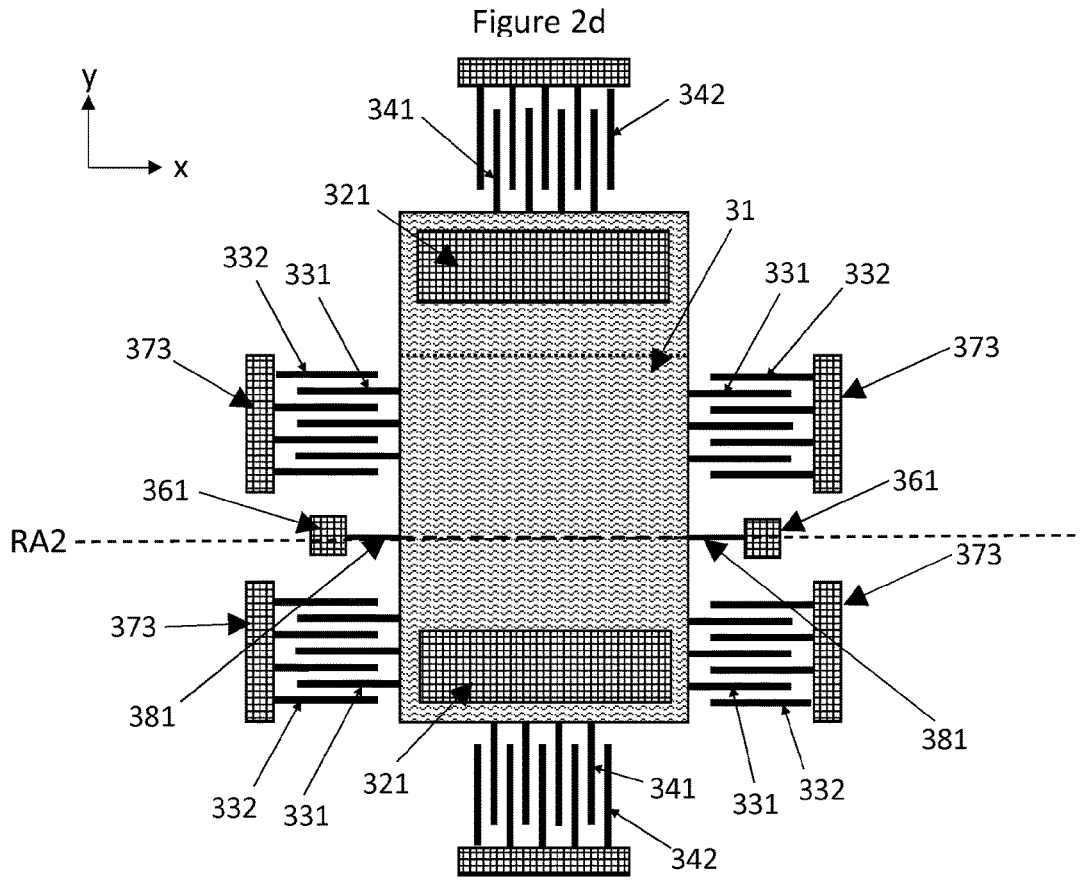
FIG. 3 also illustrates an out-of-plane acceleration sensor.

FIG. 3 illustrates an alternative configuration where the proof mass 31 is configured to rotate as a seesaw about rotation axis RA2 when the sensor undergoes acceleration in the z-direction. The proof mass 31 is attached to anchor points 361 by torsion beams 381. In this case, the rotor measurement plates 321 lie flat on the surface of the proof mass. Corresponding stator measurement plates (not illustrated in FIG. 3) may be aligned with the rotor measurement plates above and/or below the device plane, for example on the inside surface of the packaging which surrounds the cavity where the proof mass 31 is configured to move. The stator measurement plates may overlie or underlie the rotor measurement plates. The decreasing or increasing distance between these measurement plates influences the capacitance between these plates, and the displacement of the proof mass due to acceleration can thereby be measured. The sensing sense axis is again parallel to the z-axis.

Two sets of damping plates are illustrated in FIG. 3. Either set may be used without the other, or the two sets may be used together as illustrated in FIG. 3. First rotor damping plates 331 and first stator damping plates 332 are configured to damp vibrations in the direction of a first damping axis, which is in this case parallel to the y-axis, while second rotor damping plates 341 and second stator damping plates 342 are configured to damp vibrations in the direction of a third damping axis, which is in this case parallel to the x-axis.

Furthermore, if the vertical distance between the rotor measurement plates 321 and the stator measurement plates is sufficiently narrow, these plates may damp vibrations in the direction of a second damping axis, which is in this case parallel to the z-axis. In other words, in this configuration the first damping is orthogonal to the third damping axis. If the second damping axis exists, it is parallel to the sense axis and orthogonal to both the first damping axis and the third damping axis.

Second Embodiment

Figure 4:
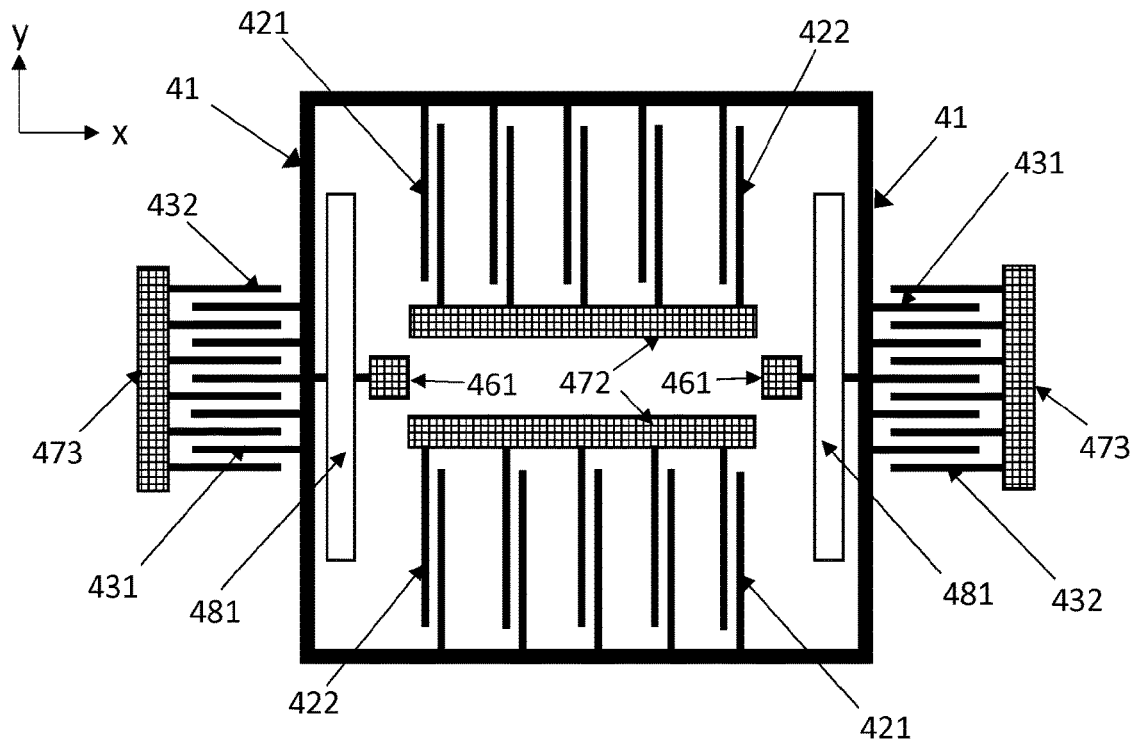
FIG. 4 illustrates an in-plane acceleration sensor.
Figure 5:
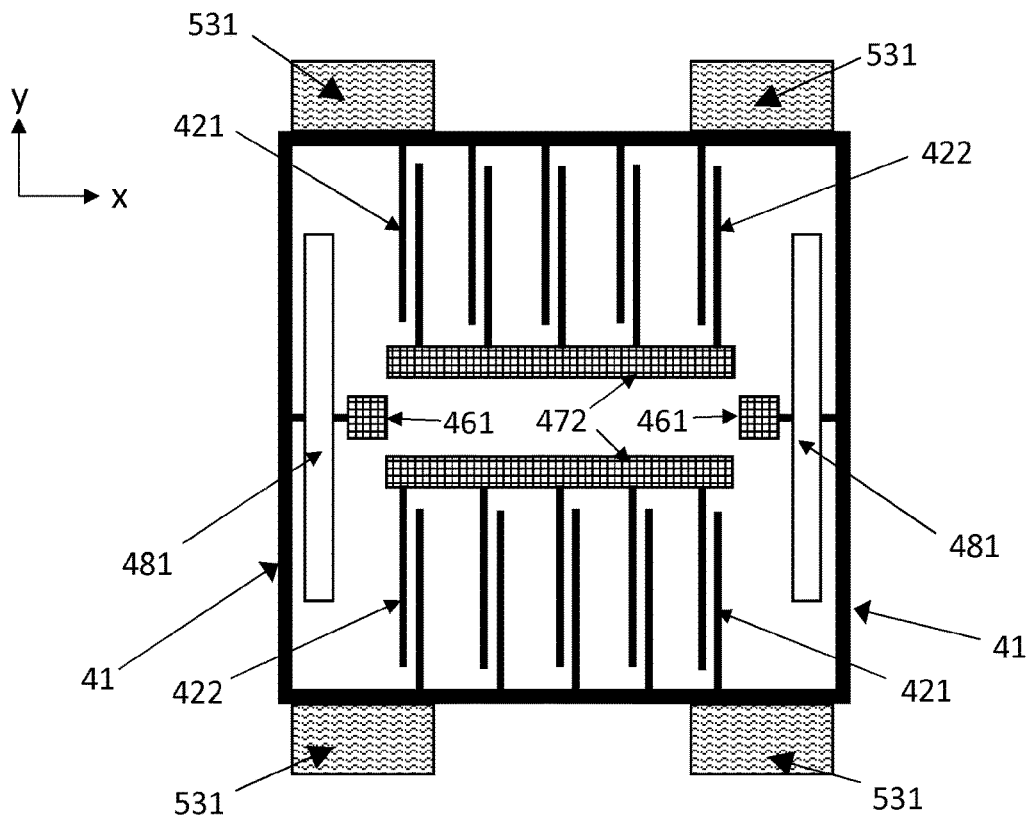
FIG. 5 also illustrates an in-plane acceleration sensor.

In a second embodiment, the sensor may be an in-plane sensor, where the sense axis lies in the substrate plane. FIG. 4 illustrates schematically an in-plane acceleration sensor where the sense axis is parallel to the x-axis. A proof mass 41 is suspended from anchor points 461 by a set of suspension springs 481. The suspension springs 481 may be of any kind, as long as they allow the proof mass 41 to move along the axis in response to an acceleration component in that direction. Proof mass 41 is depicted as a frame structure in FIG. 4, with plates, anchors, and springs inside the frame structure in the xy-plane. Alternatively, the proof mass could be a solid body, and the combs, anchors, springs etc. could be placed outside of the edges of that body. The anchor point could for example be located on a fixed frame which surrounds the proof mass, and the springs could suspend the proof mass from that fixed frame. In other words, although a frame-shaped proof mass is illustrated in FIGS. 4-5, the same damping geometry can be used also with a solid proof mass.

In FIG. 4, the acceleration sensor comprises rotor measurement plates 421 attached to the proof mass and stator measurement plates 422 attached to anchor bars 472. A capacitive measurement can be conducted between the rotor measurement plates and the stator measurement plates to monitor the gap width in the x-direction, which is determined by acceleration in the x-direction.

First rotor damping plates 431 are attached to the proof mass, and first stator damping plates 432 are attached to a fixed structure 473. These damping plates form a set of parallel plates which are orthogonal to the y-axis, which is in this case the first damping axis. The gaps between the first rotor damping plates and the first stator damping plates are sufficiently narrow to facilitate gas damping in the direction of the first damping axis.

As in the first embodiment, the one or more rotor measurement plates and the one or more stator measurement plates may also in this embodiment form a second set of substantially parallel plates which are substantially orthogonal to a second damping axis, and the gaps between the one or more rotor measurement plates and the one or more stator measurement plates may be configured to be sufficiently narrow to facilitate gas damping in the direction of the second damping axis.

The second damping axis may be substantially parallel to the sense axis, as illustrated in FIG. 4. When the gaps between rotor measurement plates 421 and stator measurement plates 422 is arranged to be sufficiently narrow, gas damping can occur in the x-direction.

As in the first embodiment, one or more second rotor damping plates may be attached to the proof mass and one or more second stator damping plates attached to a fixed structure in the sensor, so that they form a second set of substantially parallel plates which are substantially orthogonal to a third damping axis, and the gaps between the one or more second rotor damping plates and the one or more second stator damping plates may be configured to be sufficiently narrow to facilitate gas damping in the direction of the third damping axis. The third damping axis may be substantially parallel to the sense axis.

These second rotor damping plates and second stator damping plates have not been illustrated in FIG. 4, but they could for example extend in the y-direction from the upper and lower edges of proof mass 41, and from a parallel fixed structure. The third damping axis would in this case also be parallel to the x-axis, and thereby parallel to the sense axis.

FIG. 5 illustrates an alternative structure, where reference numbers 41, 421-422, 461, 472 and 481 indicate the same elements as in FIG. 4. The structure differs from the one illustrated in FIG. 4 in that first rotor damping plates 531 now lie flat in the xy-plane. Corresponding first stator damping plates (not illustrated) are placed above or below the device plane, for example on the inside surface of the packaging which surrounds the cavity where the proof mass 41 is configured to move. The first stator damping plates overlie or underlie the first rotor damping plates 531, and the gaps between the one or more first rotor damping plates and the one or more first stator damping plates are configured to be sufficiently narrow to facilitate gas damping in the direction of the first damping axis, which in this case is the z-axis which is perpendicular to the device plane.

The structures illustrated in FIGS. 4 and 5 may also be combined together, so that the damping plates 431-432 (which may in this case called the first damping plates) facilitate gas damping along the y-axis (which may in this case be called the first damping axis), while damping plates 531 and corresponding stator damping plates (which may in this case be called the second damping plates) facilitate gas damping along the z-axis (which may in this case be called the third damping axis). Both the first damping axis and the third damping axis are in this case perpendicular to the sense axis. In other words, the third damping axis may be substantially orthogonal to the sense axis and orthogonal to the first damping axis. This arrangement has the benefit that damping plates 431-432 also dampen rotational movement about the z-axis, as they do in FIG. 4.

Furthermore, this combined structure could even include the additional gas damping plates which were described with reference to FIG. 4, which would be configured to facilitate gas damping along the x-axis. The acceleration structure would then comprise structures which facilitate gas damping along all three axes. As before, the rotor measurement plates and stator measurement plates may also be configured to facilitate gas damping in the direction of the sense axis.

The invention claimed is:

1. A capacitive microelectromechanical acceleration sensor, comprising:
   at least one partly mobile proof mass which is configured to move in a direction of a sense axis when the sensor undergoes acceleration in the direction of the sense axis;
   one or more rotor measurement plates and one or more first rotor damping plates attached to the proof mass;
   one or more stator measurement plates and one or more first stator damping plates attached to a fixed structure in the sensor;
   wherein the one or more rotor measurement plates and the one or more stator measurement plates are configured so that movement of the proof mass in the direction of the sense axis can be measured in a capacitive measurement conducted between them,
   wherein the one or more first rotor damping plates and the one or more first stator damping plates form a first set of substantially parallel plates which are substantially orthogonal to a first damping axis, and gaps between the one or more first rotor damping plates and the one or more first stator damping plates are configured to be sufficiently narrow to facilitate gas damping in a direction of the first damping axis,
   wherein the first damping axis is substantially orthogonal to the sense axis, the sensor is an in-plane sensor where the sense axis lies in the substrate plane,
   wherein the sensor further comprises one or more second rotor damping plates attached to the proof mass and one or more second stator damping plates attached to a fixed structure in the sensor,
   wherein the one or more second rotor damping plates and the one or more second stator damping plates form a second set of substantially parallel plates which are substantially orthogonal to a third damping axis, wherein gaps between the one or more second rotor damping plates and the one or more second stator damping plates are configured to be sufficiently narrow to facilitate gas damping in the direction of the third damping axis, and
   wherein the third damping axis is substantially parallel to the sense axis.

2. The capacitive microelectromechanical acceleration sensor according to claim 1, wherein the one or more rotor measurement plates and the one or more stator measurement plates form a second set of substantially parallel plates which are substantially orthogonal to a second damping axis, wherein gaps between the one or more rotor measurement plates and the one or more stator measurement plates is configured to be sufficiently narrow to facilitate gas damping in a direction of the second damping axis.

3. The capacitive microelectromechanical acceleration sensor according to claim 2, wherein the second damping axis is substantially parallel to the first damping axis and orthogonal to the sense axis.

4. The capacitive microelectromechanical acceleration sensor according to claim 2, wherein the second damping axis is substantially parallel to the sense axis.

5. The capacitive microelectromechanical acceleration sensor according to claim 1, wherein the one or more first stator damping plates or the one or more second stator damping plates are configured to be at a same electric potential as the one or more first rotor damping plates and the one or more second rotor damping plates, respectively.

* * * * *